United States Patent
Eglinger et al.

(10) Patent No.: US 8,584,340 B2
(45) Date of Patent: Nov. 19, 2013

(54) METHOD FOR PRODUCING A TIGHT, FORM-FITTING CONNECTION

(75) Inventors: Markus Eglinger, Diespeck (DE); Matthias Gramann, Renchen (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 293 days.

(21) Appl. No.: 12/999,490

(22) PCT Filed: Jun. 23, 2009

(86) PCT No.: PCT/DE2009/000865
§ 371 (c)(1),
(2), (4) Date: Dec. 16, 2010

(87) PCT Pub. No.: WO2009/155900
PCT Pub. Date: Dec. 30, 2009

(65) Prior Publication Data
US 2011/0088241 A1    Apr. 21, 2011

(30) Foreign Application Priority Data
Jun. 28, 2008  (DE) .......................... 10 2008 030 775

(51) Int. Cl.
*B21D 39/00*    (2006.01)
(52) U.S. Cl.
USPC ................... 29/505; 29/508; 29/509; 29/510; 29/511; 413/27
(58) Field of Classification Search
USPC ............... 29/505, 508, 509, 510, 511; 413/27
See application file for complete search history.

(56) References Cited

U.S. PATENT DOCUMENTS

| 2,542,255 A | * | 2/1951 | McClellan | 413/27 |
| 2,558,705 A | * | 6/1951 | Hermann | 413/27 |
| 3,910,212 A | * | 10/1975 | Konoki et al. | 413/27 |

FOREIGN PATENT DOCUMENTS

| DE | 924 322 | 2/1955 |
| DE | 1 878 413 | 8/1963 |
| EP | 1 603 377 | 12/2005 |
| EP | 1 995 121 | 11/2008 |
| FR | 2 500 980 | 9/1982 |
| GB | 1 398 766 | 6/1975 |
| WO | WO 2008/027018 | 3/2008 |

OTHER PUBLICATIONS

International Search Report of the International Searching Authority for International Application PCT/DE2009/000865, mailed Nov. 4, 2009, 3 pages, European Patent Office, HV Rijswijk, Netherlands.
English Translation of PCT Written Opinion of the International Searching Authority for International Application PCT/DE2009/000865, mailed Nov. 4, 2009, 7 pages, European Patent Office, HV Rijswijk, Netherlands.
German Search Report for German Application No. 10 2008 030 775.0, dated Mar. 25, 2009, 4 pages, with English translation, 4 pages, Muenchen, Germany.

* cited by examiner

*Primary Examiner* — Carl Arbes
(74) *Attorney, Agent, or Firm* — W. F. Fasse

(57) ABSTRACT

A method is provided for producing a tight, form-fitting connection between a housing cover and a housing body, wherein the housing cover has cover tabs protruding from an edge thereof, and an edge area of the housing body has recesses for respectively receiving the cover tabs. The method involves positioning the housing cover on the housing body and deforming the cover tabs in the housing recesses to produce the tight, form-fitting connection in a single operation with a single tool.

17 Claims, 6 Drawing Sheets

METHOD FOR PRODUCING A TIGHT, FORM-FITTING CONNECTION

FIELD OF THE INVENTION

The invention relates to a method for producing a tight, form-fitting connection between a housing cover and a housing body.

BACKGROUND INFORMATION

With the production of controller housings, in particular of control devices for the automotive industry, the housing cover is usually connected with the housing body by means of gluing, riveting or screwing. Here, usually in a first operation the housing cover is positioned on the housing body by means of a suitable positioning tool. Subsequently, the connection between the housing cover and the housing body is produced by means of a further tool.

SUMMARY OF THE INVENTION

It is, therefore, the object of the invention to create a simple and cost-saving method which makes it possible to connect a housing cover with a housing body in an automated production.

The method according to the invention describes the production of a tight, form-fitting connection between a housing cover and a housing body, for the example of a controller housing, as it is used in the automotive industry. Cover plates are arranged on the edge of the housing cover. On the edge of the housing body regions are arranged for receiving the cover plates. The regions on the edge of the housing body can be embodied as continuous recesses or as blind holes. Preferably, the positioning of the housing cover on the housing body and the production of the tight, form-fitting connection is performed in a single operation with a single tool. Once the housing cover has been positioned on the housing body, the cover plates are shaped in such a way as to produce the tight, form-fitting connection between the housing cover and the housing body in the regions of the housing body. Thus, the method is accelerated and more cost-effective by the saving of tools and separate connection means such as screws or rivets.

For increasing the tightness of the connection, between the housing cover and the housing body advantageously a circumferential seal, e.g. of polyethylene, can be arranged. The seal can be arranged alternatively on the housing cover or on the housing body, depending on the installation position. The seal can in particular be injection-molded or can be embodied as an insertion seal.

BRIEF DESCRIPTION OF THE DRAWINGS

Further advantages and features of the invention will become apparent from the subsequent description of an example of embodiment of the invention on the basis of the accompanying drawings, in which.

DETAILED DESCRIPTION OF EXAMPLE EMBODIMENTS OF THE INVENTION

Figure 1:
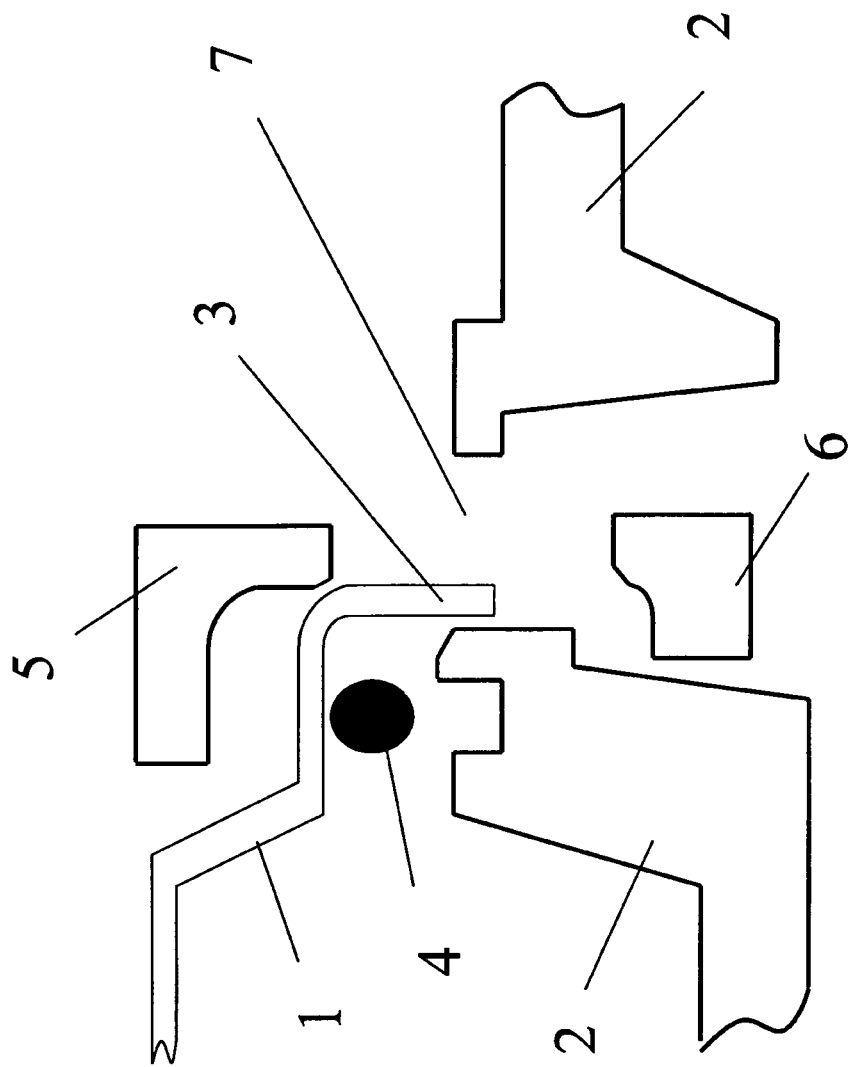
FIGS. 1 to 3 show the production of the connection, wherein on the edge of a housing body a continuous recess is embodied.
Figure 6:
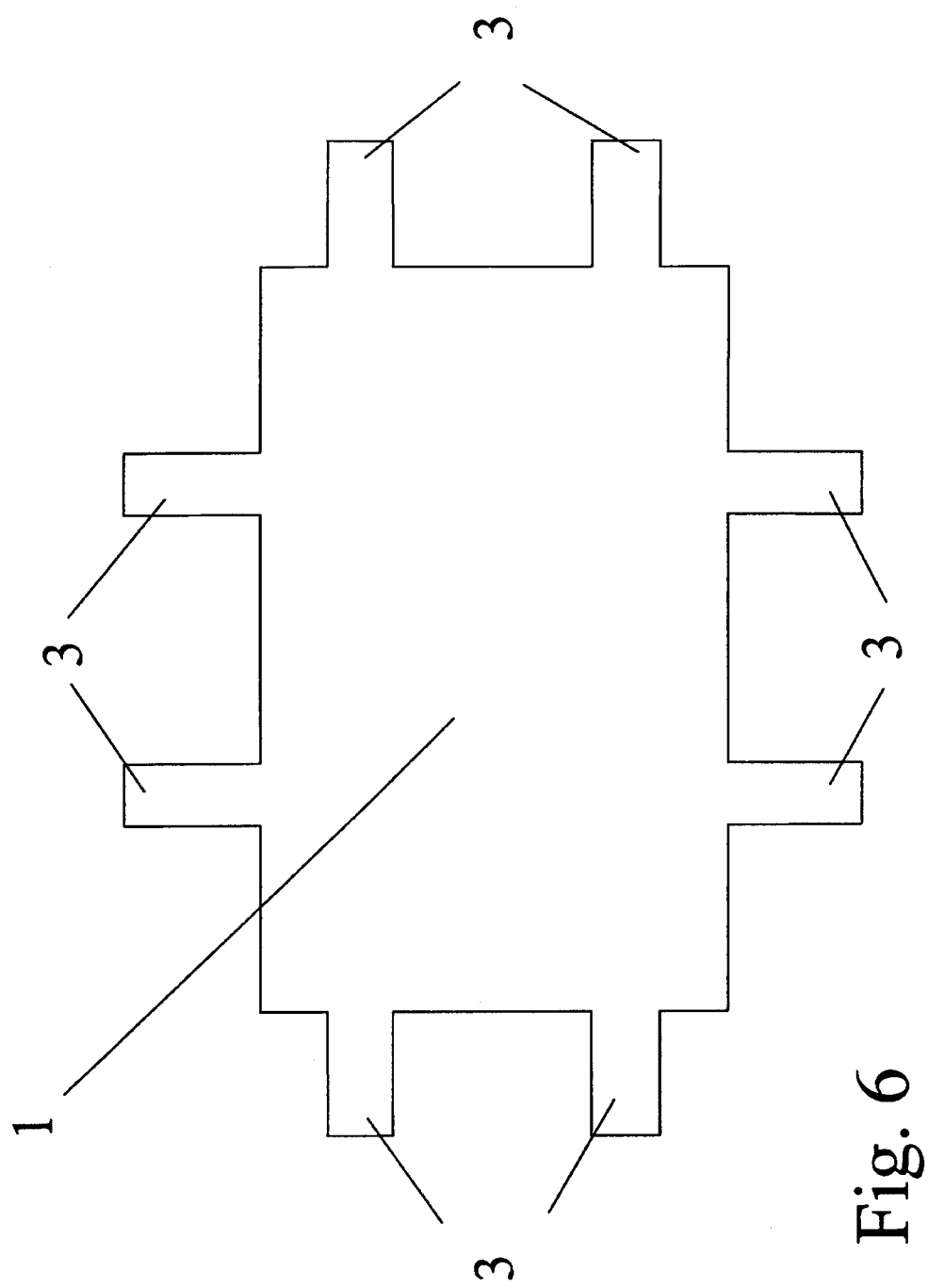
FIG. 6 shows a housing cover with cover plates.

FIG. 1 shows a housing made of a housing cover (1) and a housing body (2). On the edge of the housing cover (1) a plurality of protruding cover plates or cover tabs (3) is formed, as is shown in FIG. 6. On the edge of the housing body (2) a plurality of regions is arranged, wherein each region can respectively receive one cover plate (3). In FIG. 1 each region is embodied as an open through-going hole or recess (7), while the regions or recesses (7) are distributed discontinuously around the perimeter of the edge of the housing body (2) like the cover tabs (3) around the perimeter of the edge of the housing cover (1) as shown in FIG. 6. The cover plate or tab (3) is shown already partly protruding into the recess (7). The tool (5, 6) is embodied in two pieces, of a positioning tool (5) and a deforming tool (6).

Figure 2:
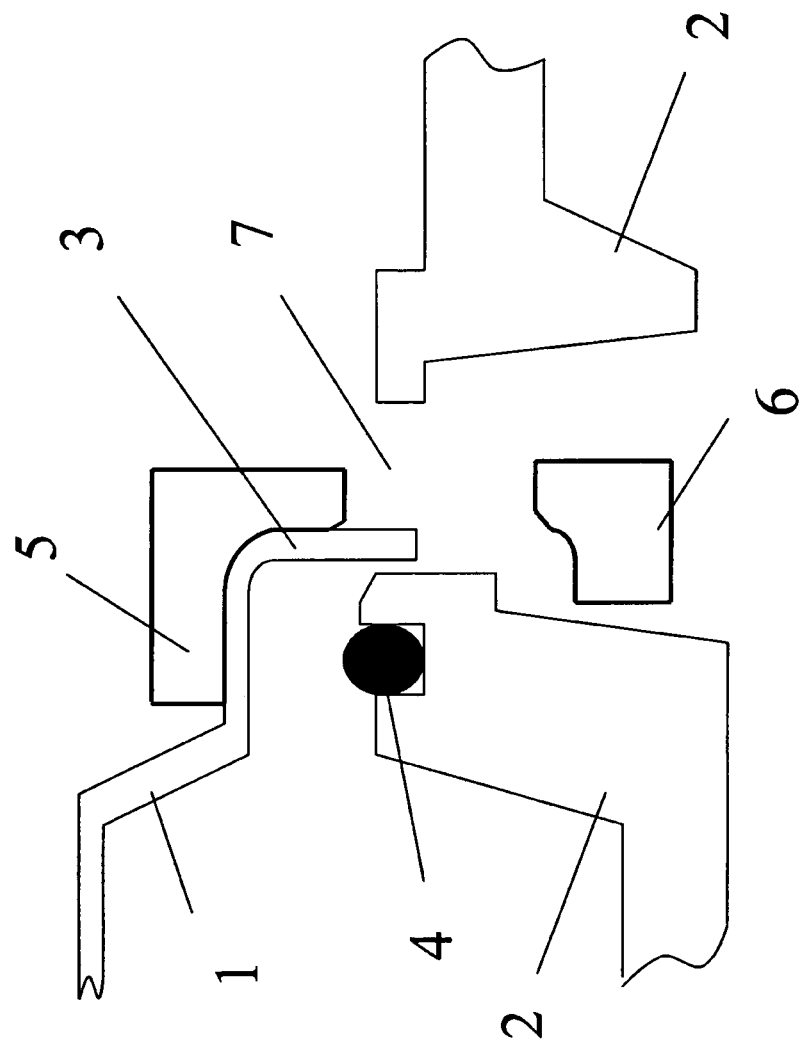

In FIG. 2 a circumferential O-ring seal (4) is inserted into a corresponding groove on the housing body (2) and the positioning tool (5) has positioned the housing cover (1) by means of the cover plates (3).

Figure 3:
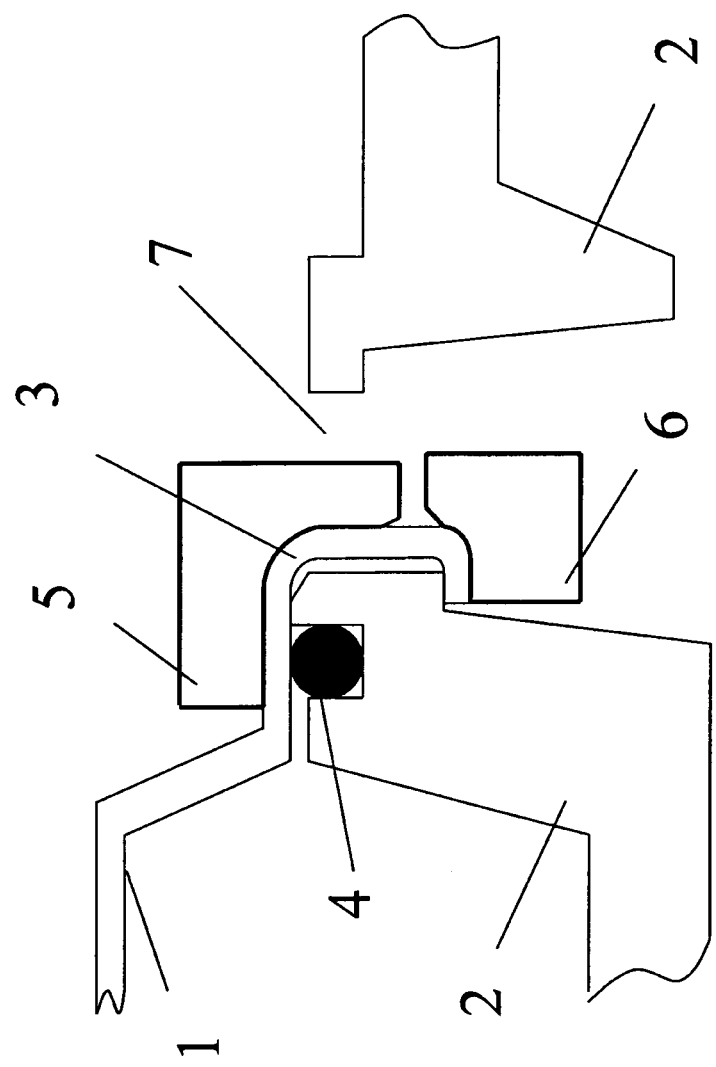

In FIG. 3 the housing cover (1) is positioned on the housing body (2) by the positioning tool (5). Simultaneously, the deforming tool (6) has flanged the cover plate or tab (3) around the edge of the housing body (2) in the recess (7). Between the housing cover (1) and the housing body (2) thus a tight, form-fitting connection is produced in a single operation with a single tool (5, 6).

Figure 4:
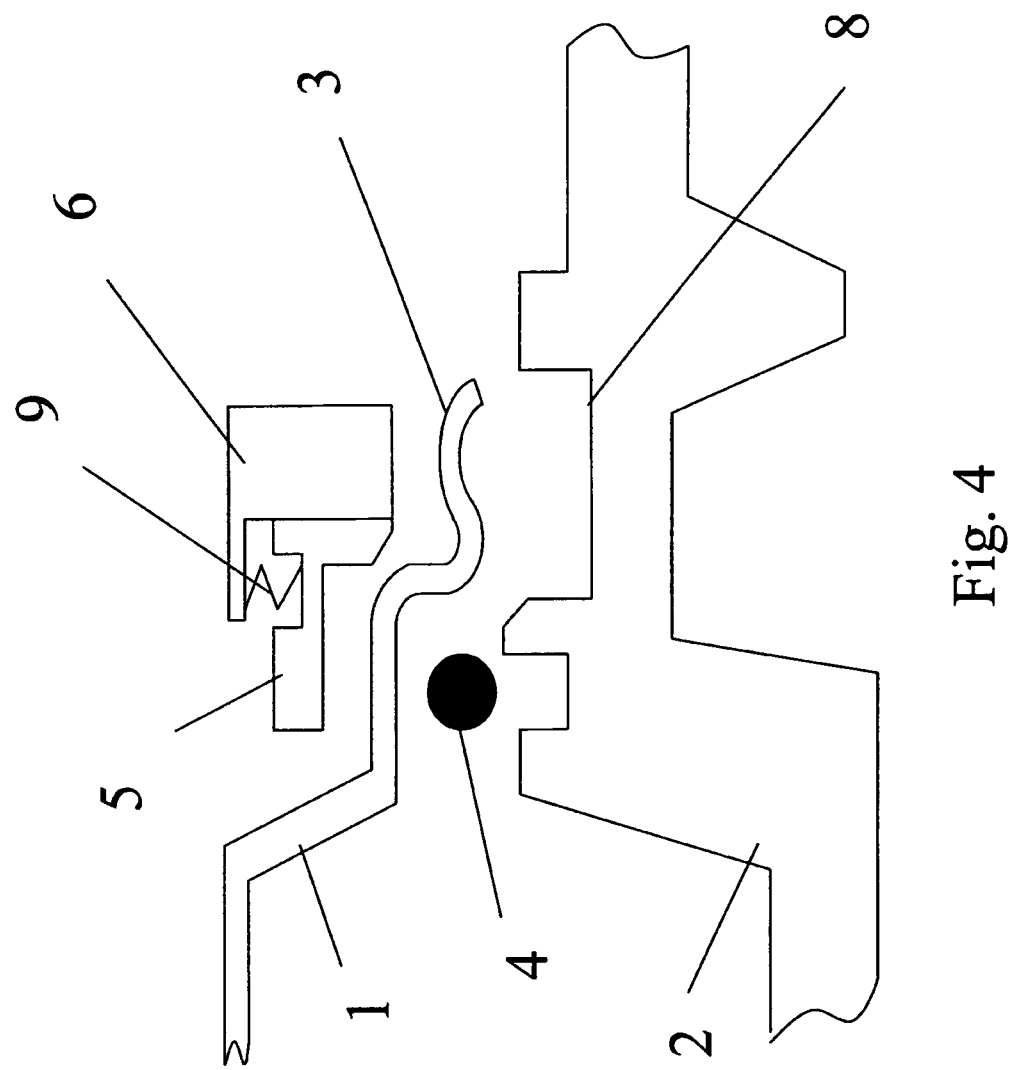
FIGS. 4 and 5 show the production of the connection, wherein on the edge of the housing body a blind hole is embodied.

FIG. 4 shows the initial situation as in FIG. 1, however, here the region on the edge of the housing body (2) is embodied as a blind hole (8) for receiving a cover plate (3). As in FIG. 4, here the cover plate (3) is already preformed.

Figure 5:
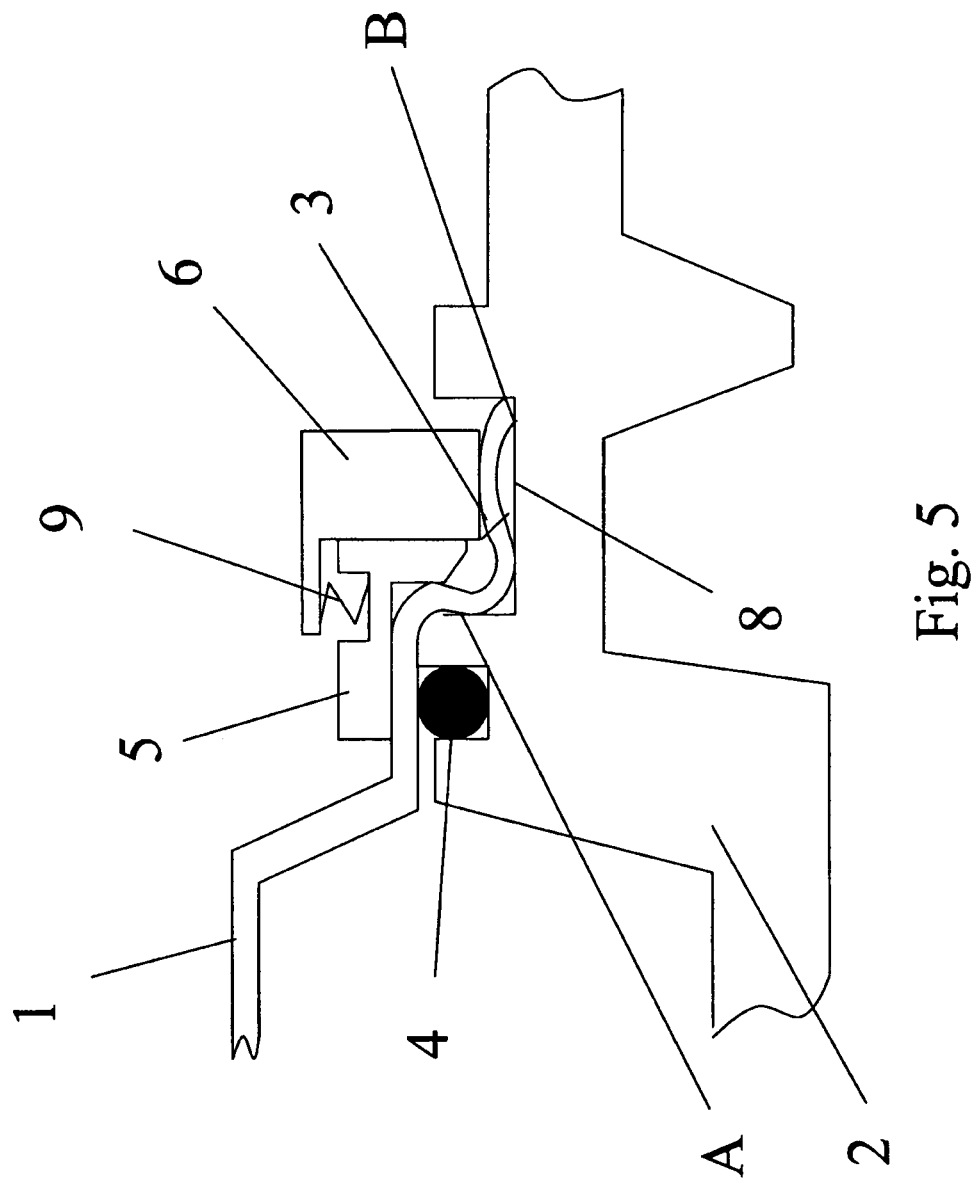

In FIG. 5 the O-ring seal (4) is inserted into a corresponding groove on the housing body (2). In a single operation, the housing cover (1) is positioned on the housing body (2) by the positioning tool (5) and the cover plate or tab (3) is positively pressed and deformed in the blind hole (8). In particular the direction of the contact pressure can be achieved by varying the height difference of the points A and B in the blind hole (8). Thus a tight, form-fitting connection between the housing cover (1) and the housing body (2) is produced in a single operation with a single tool (5, 6).

Advantageously, as is indicated in FIGS. 4 and 5, the positioning tool (5) and the deforming tool (6), are spring-loaded for the example by the spring (9). Thus, in particular rough tolerances of the individual housing parts (1, 2, 3, 7, 8) are made up, which leads to a cost saving mainly with regard to the material. Another advantage of the method is that by omission of the connection means, such as rivets or screws, the wall thickness of the housing cover (1) can be kept small.

FIG. 6 shows a housing cover (1) with two protruding cover plates or tabs (3) respectively on each side. The number of the cover plates (3) per side can vary as needed.

The invention claimed is:

1. A method for producing a tight form-fitting connection between a housing cover and a housing body, wherein the housing cover has cover tabs protruding from an edge of the housing cover, and wherein the housing body has receiver regions provided adjacent to an edge of the housing body for receiving the cover tabs, said method comprising positioning the housing cover on the housing body and producing the tight form-fitting connection in a single coordinated operation with a single coordinated tool, wherein, once the housing cover has been positioned on the housing body using the single coordinated tool, then the producing of the tight form-fitting connection comprises shaping the cover tabs using the single coordinated tool to produce the tight form-fitting connection with the cover tabs received and engaged in the receiver regions of the housing body.

2. The method according to claim 1, wherein the receiver regions are continuous through-going holes penetrating through the housing body adjacent to the edge thereof, and the producing of the tight form-fitting connection comprises engaging the cover tabs respectively into the through-going holes and flanging the cover tabs respectively around respective edges of the through-going holes in the housing body.

3. The method according to claim 1, wherein the receiver regions are blind holes in the housing body adjacent to the edge of the housing body, and the producing of the tight form-fitting connection comprises compressing the cover tabs respectively into the blind holes.

4. The method according to claim 1, further comprising arranging a circumferential seal member between the housing cover and the housing body before the producing of the tight form-fitting connection.

5. The method according to claim 4, wherein the arranging comprises arranging the circumferential seal member on the housing cover.

6. The method according to claim 4, wherein the arranging comprises arranging the circumferential seal member on the housing body.

7. A method of securing a housing cover on a housing body, wherein said housing cover has plural cover tabs protruding from an edge thereof, said cover tabs are distributed discontinuously around a perimeter of said edge of said housing cover, said housing body has plural receiver holes therein at locations corresponding to said cover tabs, and said method comprises the steps:
   a) using a first tool member, positioning said housing cover on said housing body so that said cover tabs of said housing cover respectively align with and reach into said receiver holes of said housing body;
   b) using a second tool member, deforming said cover tabs of said housing cover to respectively engage said receiver holes of said housing body, thereby establishing a tight form-fitting connection of said housing cover onto said housing body, which secures said housing cover on said housing body;
   wherein said positioning and said deforming are performed as directly successive steps in sequence one after another.

8. The method according to claim 7, wherein said positioning and said deforming are performed as directly successive steps in sequence one after another without moving any one of said housing body and said housing cover between or during said directly successive steps.

9. The method according to claim 7, wherein during said deforming using said second tool member, said first tool member remains in its position reached when completing said positioning.

10. The method according to claim 7, wherein said first tool member includes a horizontal tool surface and a vertical tool surface, and wherein during said positioning said horizontal tool surface of said first tool member contacts and positions a horizontal top surface of said housing cover and said vertical tool surface of said first tool member contacts and positions a vertical outer side surface of a respective one of said cover tabs.

11. The method according to claim 10, wherein said second tool member includes a horizontal tool surface, and wherein during said deforming said horizontal tool surface of said second tool member contacts and deforms a horizontally extending portion of said respective cover tab so as to engage said respective cover tab in a respective one of said receiver holes.

12. The method according to claim 7, wherein said receiver holes are respective through-going open holes penetrating through said housing body, said through-going open holes respectively include undercut rims, and said deforming comprises bending said cover tabs around said undercut rims so as to engage said cover tabs under said undercut rims in said through-going open holes.

13. The method according to claim 12, wherein said positioning of said housing cover is performed by moving said first tool member downwardly, and said bending of said cover tabs around said undercut rims is performed by moving said second tool member upwardly toward said first tool member.

14. The method according to claim 7, wherein said receiver holes are respective blind holes recessed into said housing body without penetrating through said housing body, and said deforming comprises bending a transversely extending portion of a respective one of said cover tabs to be transversely compressively braced between opposite sidewalls of a respective one of said blind holes.

15. The method according to claim 14, wherein said positioning of said housing cover is performed by moving said first tool member downwardly, and said bending of said transversely extending portion of said respective cover tab is performed by moving said second tool member downwardly.

16. The method according to claim 7, wherein said positioning and said deforming are performed by driving one of said tool members downwardly, and moving another of said tool members spring-biasedly together with said one of said tool members with a spring-biased coupling therebetween.

17. The method according to claim 7, further comprising, before said step a), arranging an elastic perimeter seal member between said housing cover and said housing body around a perimeter of a housing cavity enclosed between said housing cover and said housing body, so that said tight form-fitting connection established in said step b) is tightly sealed by said elastic perimeter seal member.

* * * * *